United States Patent [19]

Hill

[11] Patent Number: 5,157,288
[45] Date of Patent: Oct. 20, 1992

[54] PHASE SHIFTING CIRCUITS

[75] Inventor: Stephen R. Hill, Stoke-on-Trent, England

[73] Assignee: GEC Alsthom Limited, England

[21] Appl. No.: 670,070

[22] Filed: Mar. 15, 1991

[30] Foreign Application Priority Data

Mar. 21, 1990 [GB] United Kingdom ................ 9006326

[51] Int. Cl.⁵ ............................ C05F 5/00; H03L 7/00
[52] U.S. Cl. ..................................... 307/511; 307/262;
307/264; 307/350; 323/212; 330/107
[58] Field of Search ............... 307/511, 262, 264, 350;
323/212, 217; 328/155; 330/107

[56] References Cited

U.S. PATENT DOCUMENTS

| | | | |
|---|---|---|---|
| 4,087,737 | 5/1978 | De Gennaro | 307/511 |
| 4,506,231 | 3/1985 | Green, Jr. et al. | 307/511 |
| 4,792,744 | 12/1988 | Antoine | 307/511 |
| 4,935,701 | 6/1990 | Kawai et al. | 307/511 |
| 4,958,120 | 9/1990 | Gopinathan et al. | 307/511 |

FOREIGN PATENT DOCUMENTS

| | | |
|---|---|---|
| 1345200 | 1/1974 | United Kingdom . |
| 1395173 | 5/1975 | United Kingdom . |
| 1474952 | 5/1977 | United Kingdom . |

*Primary Examiner*—Eugene R. LaRoche
*Assistant Examiner*—Michael B. Shingleton
*Attorney, Agent, or Firm*—Kirschstein, Ottinger, Israel & Schiffmiller

[57] ABSTRACT

A phase shifting circuit includes: a pair of input terminals; a pair of output terminals; a variable gain amplifier and an active alternating current integrator, connected in series between the input terminals and the output terminals; and a control circuit for controlling the gain of the amplifier in dependence on the voltage between the input terminals and the voltage between the output terminals so as to maintain the amplitude of the voltage between the output terminals substantially equal to the amplitude of the voltage between the input terminals. The phase shifting circuit exhibits low variation of phase shift with input signal frequency.

8 Claims, 2 Drawing Sheets

PHASE SHIFTING CIRCUITS

BACKGROUND OF THE INVENTION

1. Field of the Invention

This invention relates to phase shifting circuits.

More especially, but not exclusively, the invention relates to phase shifting circuits suitable for use in alternating current (AC) electric power measuring systems to provide the 90° phase shift on voltage or current input required to enable an active power measuring device to measure reactive power.

2. Description of Related Art

Conventionally such systems use for this purpose a phase shifting circuit comprising a passive, i.e. resistance-capacitance, network and a single operational amplifier. Such phase shifting circuits exhibit variation of phase shift and gain with frequency to an extent such that Ac power measuring systems incorporating them have a lower grade specification when measuring reactive power than when measuring active power.

SUMMARY OF THE INVENTION

It is an object of the present invention to provide a phase shifting circuit which can be used to overcome this problem.

According to the present invention there is provided a phase shifting circuit comprising: a pair of input terminals; a pair of output terminals; an active alternating current integrator and a variable gain amplifying means connected in series between said input terminals and output terminals; and control means for controlling the gain of said amplifier in dependence on the voltage between said input terminals and the voltage between said output terminals so as to maintain the amplitude of the voltage between said output terminals substantially equal to the amplitude of the voltage between said input terminals.

For the avoidance of doubt, by an active alternating current integrator is meant an alternating current integrator which incorporates amplifying means. Such an integrator is capable of providing only a small variation in phase shift with frequency compared with a passive integrator.

Preferably, said integrator is connected between said input terminals and said amplifying means. Such an arrangement has the advantage that DC components present in the input signal of the phase shifting circuit are eliminated.

In one particular arrangement in accordance with the invention said control means comprises: first and second circuit means for respectively producing first and second direct current (DC) voltages respectively representative of the amplitudes of the voltages between said input terminals and between said output terminals; and third circuit means for producing a DC control signal representative of the difference of said first and second DC voltages.

Said first and second circuit means suitably each comprise half wave rectifying means and a low pass filter circuit.

BRIEF DESCRIPTION OF THE DRAWINGS

One phase shifting circuit in accordance with the invention will now be described, by way of example, with reference to the accompanying drawings in which.

DETAILED DESCRIPTION OF THE PREFERRED EMBODIMENT

The circuit provides a 90° phase shift and is suitable for use in a mains frequency electric power measuring system to enable the system to measure both active and reactive power.

Figure 1:
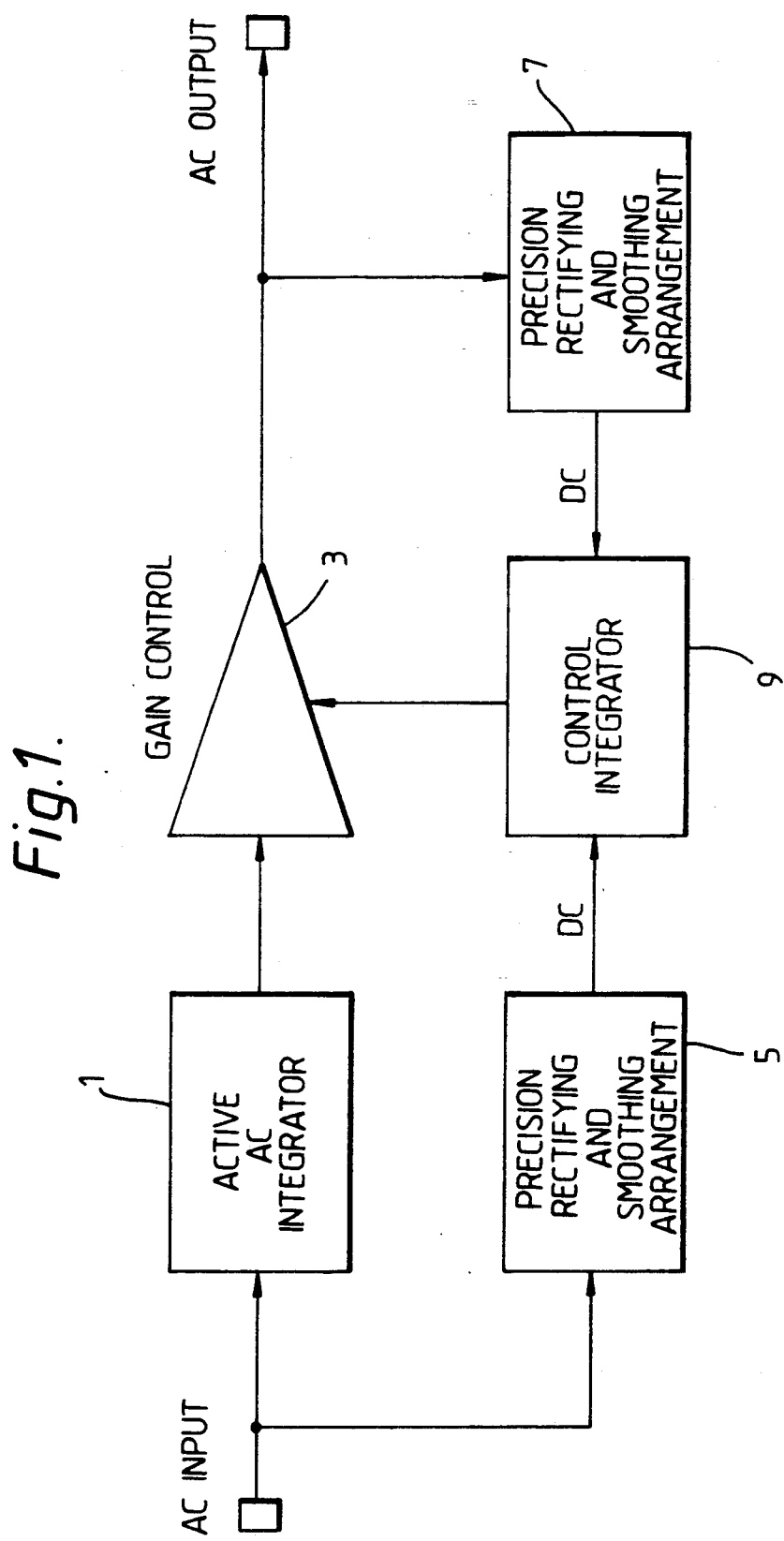
FIG. 1 is a block schematic diagram of the circuit.

Referring to FIG. 1, to produce the required phase shift the circuit includes an active AC integrator 1 to which the AC input of the phase shifting circuit is applied. The AC output of the circuit is derived from the output of the integrator 1 by way of a variable gain amplifying means 3.

The gain of the amplifying means 3 is controlled in such a manner as to maintain the amplitude of the circuit output equal to the amplitude of the circuit input. To this end the circuit input is fed to a first precision rectifying and smoothing arrangement 5 to provide a DC signal representative of the amplitude of the circuit input, and the circuit output is fed to a second precision rectifying and smoothing arrangement 7 to provide a DC signal representative of the amplitude of the circuit output. These two DC signals are fed to respective inputs of a control integrator 9 to produce a further DC signal representative of the difference between the amplitudes of the circuit input and output, which further signal is used to control the gain of the amplifying means 3 in a sense appropriate to minimize the difference.

In operation the phase shift integrator 1 serves to provide substantially the required 90° shift over a range of frequency centered on the nominal supply frequency, e.g. over a range of ±5 Hz centered on 50 Hz. As is known, while being capable of providing a phase shift of substantially 90° over a range of frequency, an active AC integrator provides an output whose amplitude varies appreciably with frequency, e.g. by 2% per Hz. However, in the phase shifter circuit of FIG. 1 this shortcoming is overcome by the automatic control of the gain of the amplifying means 3, as described above.

Figure 2:
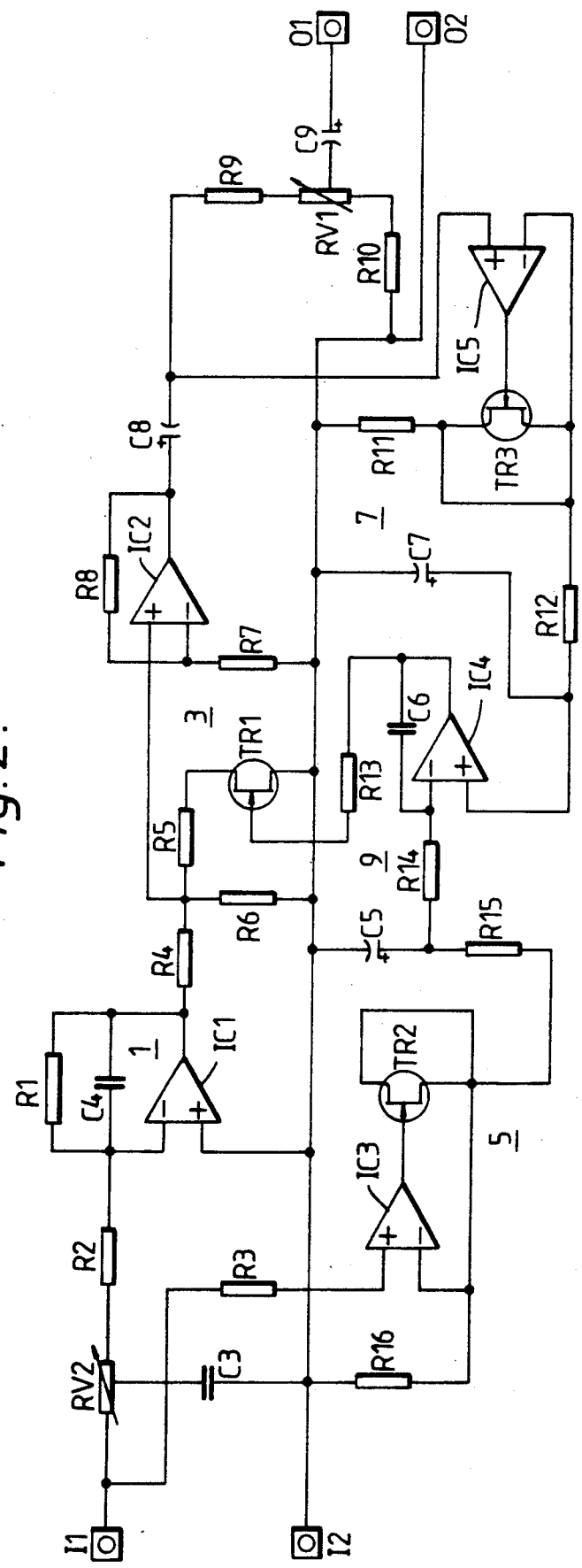
FIG. 2 is a full schematic diagram of the circuit.

Referring now to FIG. 2, in one particular embodiment of the circuit of FIG. 1 the input to the circuit, typically derived by way of a voltage transformer (not shown) when the circuit is used in a power measuring system, is applied between a pair of input terminals I1, I2.

One of terminals (I1) is connected to the inverting input of an operational amplifier IC1 via a potentiometer RV2 and a fixed resistor R2 which, with a capacitor C3 connected between the tapping point on the potentiometer RV2 and the other input terminal I2, forms a phase setting circuit. The terminal I2, which is normally grounded in operation, is also connected to the non-inverting input of amplifier IC1 which, with parallel resistor and capacitor feedback components R1 and C4, constitutes the integrator 1.

The output of the amplifier IC1 is applied via a variable attenuating network comprising resistors R4, and R5 and R6 and a J-FET controllable resistance TR1 to the non-inverting input of a second operational amplifier IC2 having a feedback resistor R8, the inverting input of the amplifier being connected to ground via a resistor R7. The amplifier IC2 together with the variable attenuating network R4, R5, R6, TR1 constitutes the variable gain amplifying means 3.

The output of the circuit appears between a pair of output terminals 01, 02, the terminal 02 being connected to the input terminal I2. The other output terminal 01 is connected via a capacitor C9 to the tapping point on a potentiometer RV1, one end of which is connected to the output terminal 02 via a resistor R10 and the other end of which is connected via a resistor 9 and a capacitor C8 in series to the output of the amplifier IC2.

The precision rectifier and smoothing arrangement 5 comprises an operational amplifier IC3 to whose non-inverting input the input terminal I1 is connected via a resistor R3, and whose inverting input is connected to input terminal I2 via a resistor R16. The output of the amplifier IC3 is connected to the control electrode of a J-FET TR2 whose source and drain are both connected to the inverting input of amplifier IC3 so that the transistor TR2 with amplifier IC3 operate as a low leakage half wave rectifier. The rectified signal at the source/-drain of TR2 is applied by way of a low pass filter smoothing circuit comprising two resistors R14 and R15 and a capacitor C5 to the inverting input of an operational amplifier IC4 which has a feedback path constituted by a capacitor C6 and constitutes the control integrator 9.

The precision rectifier and smoothing arrangement 7 for the output of the phase shifting circuit is constituted by an operational amplifier IC5, a J-FET TR3, a resistor R12 and a capacitor C7 connected in corresponding manner to components IC3, TR2, R15 and C5 of the rectifying and smoothing arrangement 5, the non-inverting input of the amplifier IC5 being connected to the junction between the capacitor C8 and the resistor R9 and the inverting input of the amplifier IC5 being connected to terminal 02 via a resistor R11 corresponding to resistor R16 of the rectifier and smoothing arrangement 5.

The output of the amplifier IC4 in the control integrator 9 is applied to the control electrode of the transistor TR1 in the variable attenuating network in the variable gain amplifying means 3 by way of a resistor R13.

The phase setting circuit RV2, C3 allows compensation for phase errors in devices via which a signal to be phase shifted is applied to input terminals I1, I2, e.g. phase lead errors in a voltage transformer. Since the phase setting circuit is within the gain control loop any effect on gain of the phase setting circuit is eliminated.

The components RV1, R9 and R10 at the output of the phase shifting circuit enable variation of the amplitude of the output of the phase shifting circuit for scaling and calibration purposes e.g. when calibrating a power meter 8 to which the output of the phase shifting circuit is applied.

To provide compensation for non-linearity in the signal applied to the input of the phase shifting circuit, e.g. by a voltage transformer, a small DC voltage may be injected into the input of one or other of the precision rectifier and smoothing arrangements 5 and 7 e.g. from a source 10 as shown in FIG. 1.

It will be appreciated that the performance of the circuit of FIG. 2 is relatively independent of the tolerance of all the resistors therein except R9 and R10. In this connection it is pointed out that when used in a power measuring system, the components RV1, R9, R10, RV2 and C3 may form part of a wattmeter used in the system.

A comparison of the performance of one particular embodiment of the circuit shown in FIG. 2 and a typical comparable prior art phase shifting circuit is given below.

| Parameter | FIG. 2 | Prior Art |
|---|---|---|
| Output voltage/frequency | ±0.01%/Hz | ±0.3%/Hz |
| Phase shift/frequency | ±0.025°/Hz | ±0.1°/Hz |
| Output voltage/temperature | ±20 ppm/°C. | ±65 ppm/°C. |

I claim:

1. In an electrical power measuring system, a phase shifting circuit comprising: a pair of input terminals to which is conducted an input signal having an amplitude and a frequency in a range of power supply frequencies; a pair of output terminals from which is conducted an output signal having an amplitude; a variable gain amplifying means and an active alternating current integrator connected in series between said input terminals and output terminals, said integrator exhibiting a substantially constant phase shift and a variable gain over said range; and control means for controlling the gain of said amplifying means in dependence on the voltage between said input terminals and the voltage between said output terminals so as to maintain the amplitude of the voltage between said output terminals substantially equal to the amplitude of the voltage between said input terminals.

2. A circuit according to claim 1 wherein said integrator is connected between said input terminals and said amplifying means.

3. A circuit according to claim 1 wherein said control means comprises: first and second circuit means for respectively producing first and second direct current (DC) voltages respectively representative of the amplitudes of the voltages between said input terminals and between said output terminals; and third circuit means for producing a DC control signal representative of the difference of said first and second DC voltages.

4. A circuit according to claim 3 wherein said first and second circuit means each comprise half wave rectifying means and a low pass filter circuit.

5. A circuit according to claim 3 wherein said third circuit means comprises an operational amplifier integrator circuit.

6. A circuit according to claim 1 wherein said variable gain amplifying means comprises a resistive variable attenuating network feeding an amplifier circuit.

7. A circuit according to claim 1 including a phase setting circuit between said input terminals and said variable gain amplifying means.

8. A circuit according to claim 1 wherein said active alternating current integrator comprises an operational amplifier with a feedback path comprising parallel resistive and capacitive path.

* * * * *